United States Patent
Lee et al.

(10) Patent No.: US 8,013,523 B2
(45) Date of Patent: Sep. 6, 2011

(54) ORGANIC LIGHT EMITTING DEVICE AND MANUFACTURING METHOD THEREOF

(75) Inventors: Dong-Won Lee, Seongnam-si (KR); Chang-Woong Chu, Suwon-si (KR); Jin-Koo Chung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 283 days.

(21) Appl. No.: 12/243,444

(22) Filed: Oct. 1, 2008

(65) Prior Publication Data

US 2009/0212689 A1    Aug. 27, 2009

(30) Foreign Application Priority Data

Feb. 25, 2008   (KR) .................. 10-2008-0016911

(51) Int. Cl.
*H01J 1/62*   (2006.01)
(52) U.S. Cl. ....................... 313/505; 313/506
(58) Field of Classification Search ........... 313/504–512
See application file for complete search history.

(56) References Cited

U.S. PATENT DOCUMENTS

| | | | | |
|---|---|---|---|---|
| 6,555,969 B2* | 4/2003 | Yamazaki | | 313/506 |
| 7,535,164 B2* | 5/2009 | Nakajima et al. | | 313/504 |
| 7,764,013 B2* | 7/2010 | Lee et al. | | 313/506 |
| 2005/0023969 A1* | 2/2005 | Omata et al. | | 313/504 |
| 2007/0018150 A1* | 1/2007 | Nakajima et al. | | 257/10 |
| 2008/0024402 A1* | 1/2008 | Nishikawa et al. | | 345/82 |
| 2009/0160331 A1* | 6/2009 | Omata et al. | | 313/506 |
| 2009/0256477 A1* | 10/2009 | Chung et al. | | 313/505 |
| 2010/0181554 A1* | 7/2010 | Yoshida et al. | | 257/40 |

FOREIGN PATENT DOCUMENTS

| | | |
|---|---|---|
| JP | 2003017273 | 1/2003 |
| JP | 2004063359 | 2/2004 |
| JP | 2005331665 | 12/2005 |
| JP | 2006253443 | 9/2006 |
| JP | 2006294364 | 10/2006 |
| JP | 2007095614 | 4/2007 |
| KR | 100717332 | 10/2006 |
| KR | 1020070025032 | 3/2007 |
| KR | 100709194 | 4/2007 |
| KR | 1020070038789 | 4/2007 |
| KR | 1020070056566 | 6/2007 |
| KR | 1020070060688 | 6/2007 |

* cited by examiner

*Primary Examiner* — Peter Macchiarolo
(74) *Attorney, Agent, or Firm* — Cantor Colburn LLP

(57) ABSTRACT

An organic light emitting device including a substrate, a first electrode formed on the substrate and including a recess portion, a partition formed on the first electrode and including an opening exposing the recess portion of the first electrode, an organic light emitting member formed in the recess portion of the first electrode and the opening of the partition, and a second electrode formed on the partition and the organic light emitting member. A gap is formed between a lower portion of the partition and the recess portion of the first electrode and at least a portion of the organic light emitting member is disposed in the gap.

19 Claims, 9 Drawing Sheets

ORGANIC LIGHT EMITTING DEVICE AND MANUFACTURING METHOD THEREOF

This application claims priority to Korean Patent Application No. 10-2008-0016911 filed on Feb. 25, 2008, and all the benefits accruing therefrom under 35 U.S.C. §119, the contents of which in its entirety are herein incorporated by reference.

BACKGROUND OF THE INVENTION

1. Field of the Invention

The present invention relates to an organic light emitting device and a manufacturing method thereof.

2. Description of the Related Art

In an active-type of flat panel display, a plurality of pixels are arranged in a matrix form, and images are displayed by controlling the luminance of each pixel according to predetermined display information. Among such active matrix flat panel display devices, an organic light emitting display is a self-emissive display device having low power consumption, a wide viewing angle, and a high response speed, so that the organic light emitting display is being spotlighted as a next-generation display device to surpass the liquid crystal display ("LCD").

The organic light emitting device includes an organic light emitting element i.e., two electrodes with an emission layer disposed therebetween. Electrons injected from one of the electrodes and holes injected from the other electrode are combined in the light emitting layer to form excitons, and the excitons release energy thereby causing light to be emitted.

The organic light emitting device also includes a driving transistor which drives the organic light emitting element and a switching transistor which applies data voltages to the driving transistor, and the transistors are of a thin film transistor ("TFT") type.

In the organic light emitting device, to realize the excellent emitting characteristics, the emission layer disposed between two electrodes should be uniformly formed, and a leakage current should not be generated.

However, it is difficult to uniformly form the emission layer due to the surface tension of the emission layer, and furthermore the emission layer does not cover the electrodes such that the leakage current may be generated. When the emission layer is not uniform or the leakage current is generated, a luminance deviation occurs, or the luminance is deteriorated.

BRIEF SUMMARY OF THE INVENTION

The present invention has been made in an effort to solve the above-stated problem, and aspects of The present invention provides an organic light emitting device and a manufacturing method capable of uniformly forming the emission layer and preventing leakage current.

According to an exemplary embodiment, the present invention provides an organic light emitting device which includes a substrate, a first electrode formed on the substrate and having a recess portion, a partition formed on the first electrode and having an opening exposing the recess portion of the first electrode, a organic light emitting member formed in the recess portion of the first substrate and the opening of the partition, and a second electrode formed on the partition and the organic light emitting member, a gap is formed between a lower portion of the partition and the recess portion of the first electrode and at least a portion of the organic light emitting member is disposed in the gap.

According to an exemplary embodiment, the organic light emitting member includes a hole transport layer and an emission layer, and the hole transport layer may include a portion disposed on the gap. The emission layer includes a portion disposed on the gap.

According to an exemplary embodiment, the recess portion of the first electrode includes a bottom surface and a side surface formed according to a circumference of the bottom surface.

According to an exemplary embodiment, the side surface of the recess portion is disposed in the gap. The side surface of the recess portion is substantially vertical to a bottom surface of the recess portion. The side surface of the recess portion is a curved surface and a cross-section of the side surface is of a half-circle, a quarter-circle, or a half-ellipse shape.

According to an exemplary embodiment, an interval between the lower surface of the partition and the bottom surface of the recess portion is in a range of approximately 30 Å to 2000 Å.

According to an exemplary embodiment, a thickness of the hole transport layer is in a range of approximately 500 Å to 2000 Å.

According to an exemplary embodiment, an average surface roughness of the first electrode is in range of approximately 0.5 nm to 5.0 nm.

According to an exemplary embodiment, the organic light emitting device further includes an electron transport layer formed on the emission layer and disposed in the opening of the partition.

According to an exemplary embodiment, the second electrode is disposed on the electron transport layer, and a first portion of the second electrode overlapping the electron transport layer is disposed with a same plane as a second portion of the second electrode overlapping the partition.

According to another exemplary embodiment, the present invention provides a manufacturing method of an organic light emitting device, the method including forming a first electrode on a substrate, forming a partition having an opening on the first electrode, etching the first electrode by using the partition as a mask to form a recess portion, forming a gap under the partition, forming an organic light emitting member in the recess portion by filling at least a portion of the gap, and forming a second electrode on the organic light emitting member.

According to an exemplary embodiment, the forming of the partition includes forming a photosensitive organic material layer or a photosensitive inorganic material layer on the first electrode, and exposing and etching the photosensitive organic material layer or the photosensitive inorganic material layer to form an opening exposing the first electrode.

According to an exemplary embodiment, the organic light emitting member is formed by an Inkjet method.

According to an exemplary embodiment, the organic light emitting member is filled in the gap by a capillary phenomenon.

According to an exemplary embodiment, the forming of the organic light emitting member includes forming a hole injection layer on the first electrode, and forming an emission layer on the hole injection layer.

According to an exemplary embodiment, the hole injection layer is filled in the gap.

According to an exemplary embodiment, the hole injection layer and the emission layer is filled in the gap.

According to an exemplary embodiment of the present invention, the emission layer is filled in the gap formed by the partition and the recess portion of the first electrode such that a central portion of the emission layer is prevented from becoming concave to thereby uniformly form the emission layer.

Also, the first and second electrodes are completely separated from the emission layer such that the leakage current is not generated, thereby improving the luminance.

BRIEF DESCRIPTION OF THE DRAWINGS

The above and/or other aspects, features, and advantages of the present invention will become more apparent from the following detailed description when taken in conjunction with the accompanying drawings, in which.

DETAILED DESCRIPTION OF THE INVENTION

Figure 1:
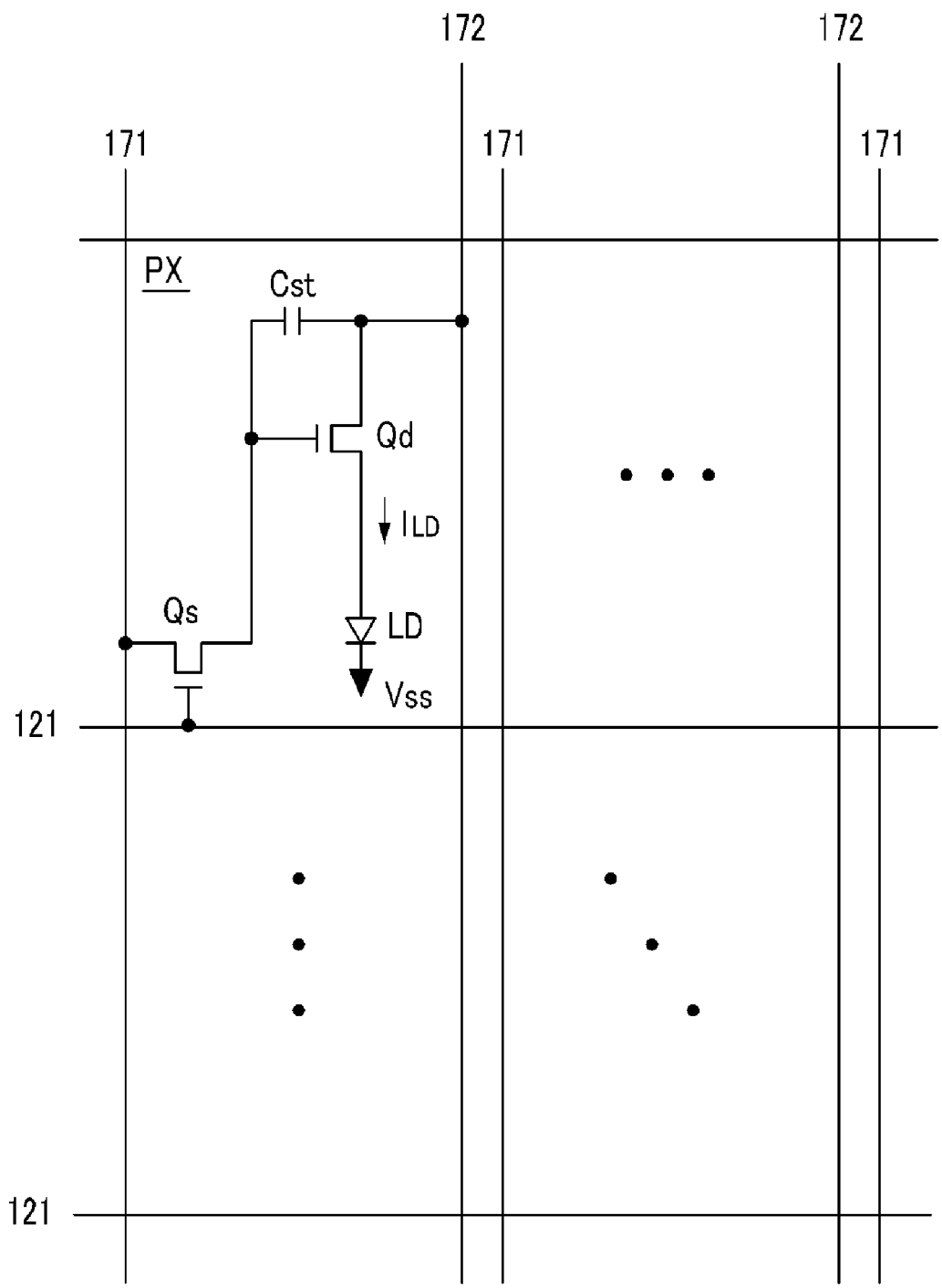
FIG. 1 is an equivalent circuit diagram of an exemplary embodiment of an organic light emitting device according to the present invention.

The invention is described more fully hereinafter with reference to the accompanying drawings, in which exemplary embodiments of the invention are shown. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

An organic light emitting device according to an exemplary embodiment of the present invention will now be described in detail with reference to FIG. 1.

FIG. 1 is an equivalent circuit diagram of an organic light emitting device according to the present invention.

Referring to FIG. 1, an organic light emitting device includes a plurality of signal lines 121, 171, and 172, and a plurality of pixels PX connected thereto and arranged substantially in a matrix.

The signal lines include a plurality of gate lines 121 which transmit gate signals (or scanning signals), a plurality of data lines 171 which transmits data signals, and a plurality of driving voltage lines 172 which transmit a driving voltage. The gate lines 121 extend substantially in a row direction and are substantially parallel to each other, and the data lines 171 and the driving voltage lines 172 extend substantially in a column direction and are substantially parallel to each other.

According to an exemplary embodiment, each pixel PX includes a switching transistor Qs, a driving transistor Qd, a storage capacitor Cst, and an organic light emitting element. The organic light emitting element is an organic light emitting diode ("OLED") LD.

The switching transistor Qs includes a control terminal connected with one of the gate lines 121, an input terminal connected with one of the data lines 171, and an output terminal connected with the driving transistor Qd. The switching transistor Qs transmits the data signals applied to the data line 171 to the driving transistor Qd in response to a gate signal applied to the gate line 121.

The driving transistor Qd includes a control terminal connected with the switching transistor Qs, an input terminal connected with the driving voltage line 172, and an output terminal connected with the organic light emitting element. The driving transistor Qd drives an output current ILD having a magnitude depending on a voltage between the control terminal and the output terminal thereof, and outputs the output current ILD to the organic light emitting element.

The storage capacitor Cst is connected between the control terminal of the driving transistor Qd and the input terminal of the driving transistor Qd. According to an exemplary embodiment, the storage capacitor Cst stores a data signal applied to the control terminal of the driving transistor Qd and maintains the data signal after the switching transistor Qs turns off.

The organic light emitting diode LD includes an anode connected with the output terminal of the driving transistor Qd and a cathode connected with a common voltage Vss. The organic light emitting element emits light including an intensity depending on the output current ILD of the driving transistor Qd, thereby displaying images.

According to the current exemplary embodiment, the switching transistor Qs and the driving transistor Qd are n-channel field effect transistors ("FETs"). However, the present invention is not limited hereto and may vary accordingly. For example, at least one of the switching transistor Qs and the driving transistor Qd may be a p-channel FET. In addition, according to an exemplary embodiment, the connections among the transistors Qs and Qd, the capacitor Cst, and the organic light emitting diode LD may be modified.

The structure of the organic light emitting device shown in FIG. 1 will now be described in detail with reference to FIG. 2 and FIG. 3.

Figure 2:
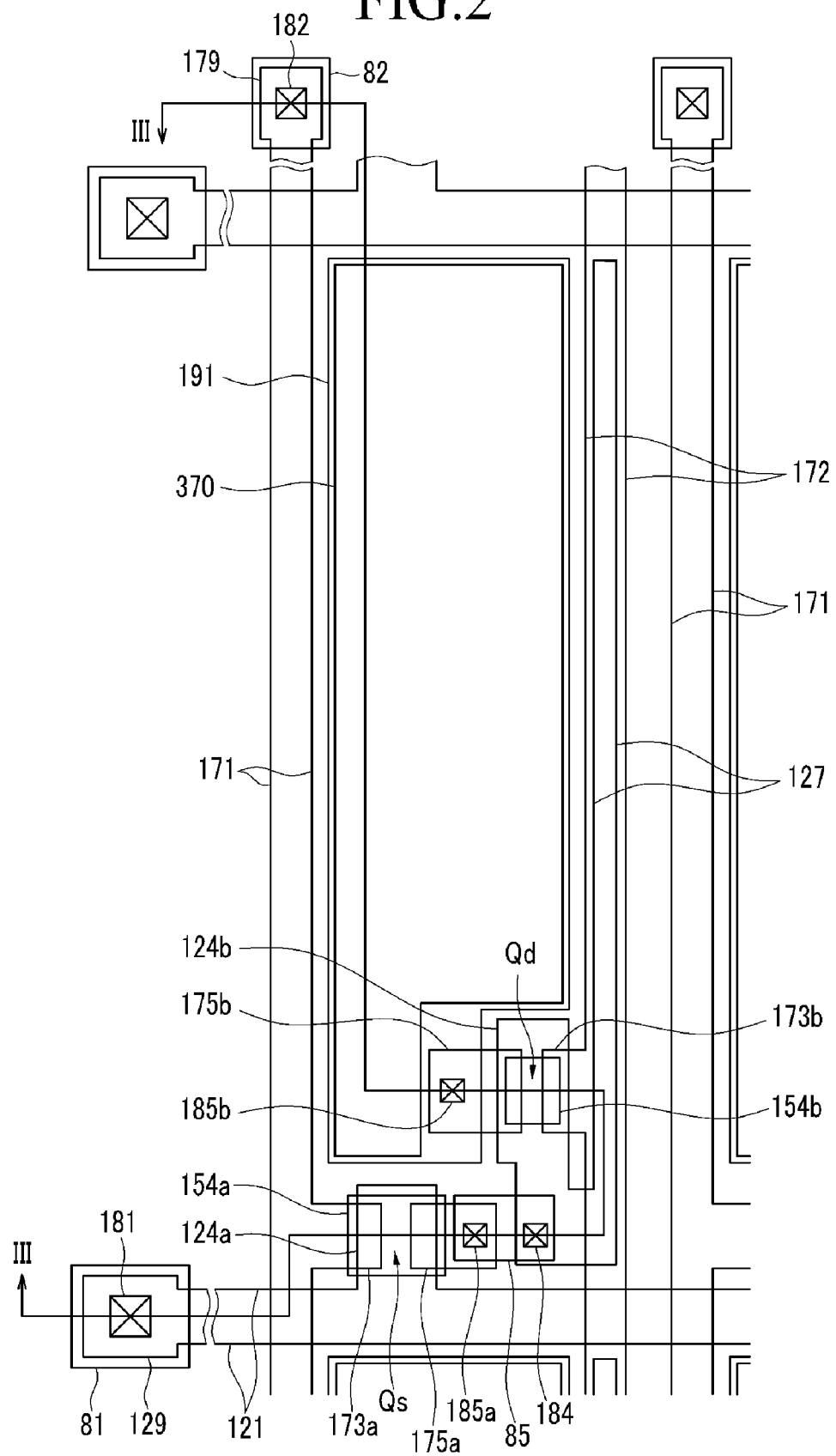
FIG. 2 is a layout view of an exemplary embodiment of an organic light emitting device according to the present invention.
Figure 3:
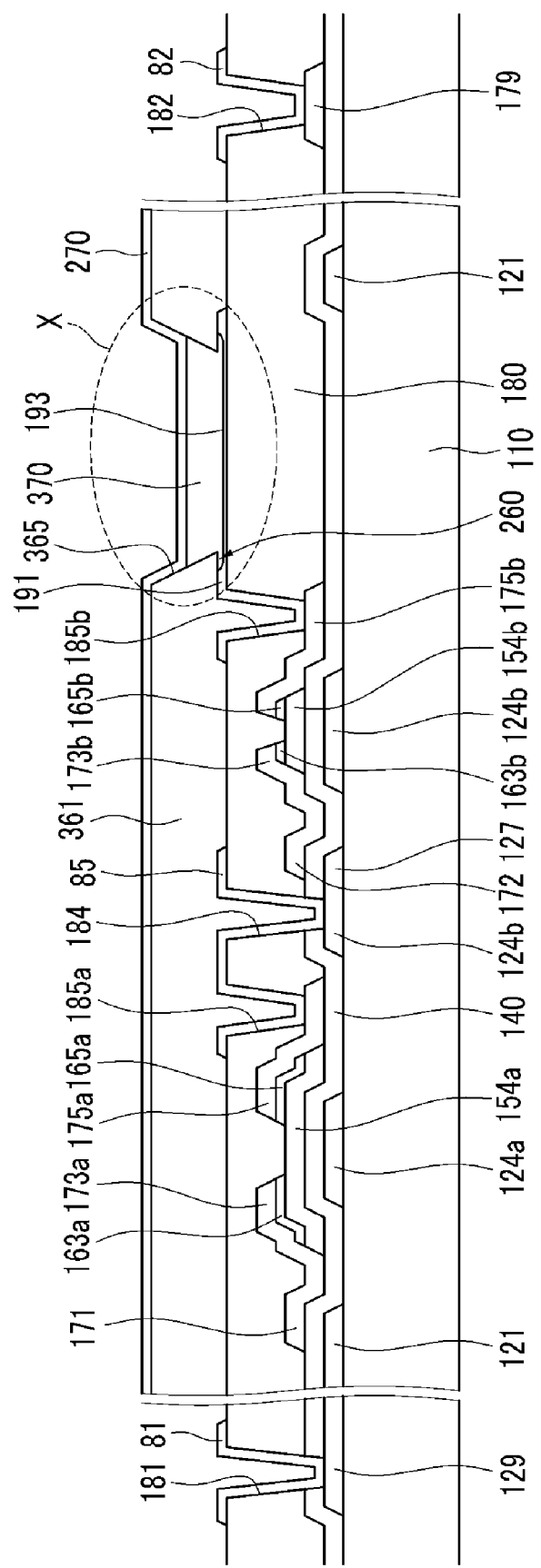
FIG. 3 is a cross-sectional view of the organic light emitting device shown in FIG. 2 taken the line III-III.

FIG. 2 is a layout view of an organic light emitting device according to an exemplary embodiment of the present invention, and FIG. 3 is a cross-sectional view of the organic light emitting device shown in FIG. 2 taken along the line III-III.

Referring to FIG. 2 and FIG. 3, a plurality of gate conductors including a plurality of gate lines 121 having a plurality of first control electrodes 124a and a plurality of second control electrodes 124b are formed on an insulating substrate 110.

The gate lines 121 transmit gate signals and are substantially extended in a horizontal direction. Each gate line 121 includes an end portion 129 having a large area for contacting with another layer or an external driving circuit, and the first control electrodes 124a are extended upward from the gate lines 121. The second control electrodes 124b are separated from the gate lines 121 and include a plurality of storage electrodes 127 extending in one direction.

According to an exemplary embodiment, a gate insulating layer 140 is made of silicon nitride (SiNx) or silicon oxide SiO2 is on the gate conductor 121, 124a, 124b, and 127.

A plurality of first semiconductors 154a and a plurality of second semiconductors 154b made of hydrogenated amorphous silicon (a-Si) or polysilicon are formed on the gate insulating layer 140. The first semiconductors 154a overlap the first control electrodes 124a and the second semiconductors 154b overlap the second control electrodes 124b.

A plurality of pairs of first ohmic contacts 163a and 165a and a plurality of pairs of second ohmic contacts 163b and 165b are respectively formed on the first and second semiconductors 154a and 154b. The first ohmic contacts 163a and 165a are disposed in pairs on the first semiconductors 154a, and the second ohmic contacts 163b and 165b are disposed in pairs on the second semiconductors 154b.

A plurality of data conductors including a plurality of data lines 171, a plurality of driving voltage lines 172, and a plurality of first and second output electrodes 175a and 175b are formed on the ohmic contacts 163a, 163b, 165a, 165b and the gate insulating layer 140.

The data lines 171 transmit data signals and extend in a vertical direction while intersecting the gate lines 121. Each data line 171 includes a plurality of first input electrodes 173a extending toward the first control electrodes 124a and an end portion 179 having a large area for contacting with another layer or an external driving circuit.

The driving voltage lines 172 transmit driving voltages and extend in a vertical direction while intersecting the gate lines 121. Each driving voltage line 172 includes a plurality of second input electrodes 173b extending toward the second control electrodes 124b and a portion overlapped with the storage electrodes 127.

The first and second output electrodes 175a and 175b are separated from each other, and are separated from the data lines 171 and the driving voltage lines 172. The first input electrodes 173a and the first output electrodes 175a are opposite to each other with respect to the first control electrodes 124a, and the second input electrodes 173b and the second output electrodes 175b are opposite to each other with respect to the second control electrodes 124b.

According to an exemplary embodiment, the data conductors 171, 172, 175a, and 175b are made of a refractory metal such as molybdenum, chromium, tantalum, and titanium, or alloys thereof.

The ohmic contacts 163a, 163b, 165a, and 165b are disposed between the semiconductors 154a and 154b thereunder and the data conductors 171, 172, 175a, and 175b, thereby reducing contact resistance therebetween. The semiconductors 154a and 154b include a portion between the input electrodes 173a and 173b and the output electrodes 175a and 175b, and the exposed portions by the data conductors 171, 172, 175a, and 175b.

A passivation layer 180 is formed on the data conductors 171, 172, 175a, and 175b, and the exposed semiconductors 154a and 154b. According to the current exemplary embodiment, the passivation layer 180 is made of an inorganic insulator or an organic insulator, and includes a flat surface.

The passivation layer 180 includes a plurality of contact holes 182, 185a, and 185b respectively exposing the end portions 179 of the data lines 171, and the first and second output electrodes 175a and 175b, and the passivation layer 180 and the gate insulating layer 140 includes a plurality of contact holes 181 and 184 respectively exposing the end portions 129 of the gate lines 121 and the second input electrodes 124b.

A plurality of pixel electrodes 191, a plurality of connecting members 85, and a plurality of contact assistants 81 and 82 are formed on the passivation layer 180. They may be made of a transparent conductive material such as ITO or IZO, or a reflective metal such as aluminum, silver, or alloys thereof.

The pixel electrodes 191 include a plurality of recess portions 193, and are connected with the second output electrodes 175b through the contact holes 185b.

The connecting members 85 are connected with the second control electrodes 124b and the first output electrodes 175a through the contact holes 184 and 185a.

The contact assistants 81 and 82 are connected with the end portions 129 and 179 through the contact holes 181 and 182, respectively. The contact assistants 81 and 82 enhance adhesion between the end portions 129 and 179 and the gate lines 121 and data lines 171, and external devices, and protect them.

A partition 361 is formed on the passivation layer 180. The partition 361 defines a plurality of openings 365 enclosing edges of the pixel electrodes 191, and is made of an organic insulator or an inorganic insulator. According to an exemplary embodiment, the partition 361 may be made of a photosensitive material including a black pigment, and the partition 361 includes a light blocking member and thus, the manufacturing process may be simplified.

A plurality of gaps 260 are formed between portions under the partitions 361 and the recess portions 193 of the pixel electrodes 191, and a plurality of organic light emitting members 370 are disposed in the gaps 260 and the openings 365.

A common electrode 270 is formed on the organic light emitting members 370. According to an exemplary embodiment, an encapsulation layer (not shown) may be formed on the common electrode 270. The encapsulation layer encapsulates the organic light emitting member 370 and common electrode 270 to prevent moisture penetration and/or oxidization.

In the organic light emitting device, the first control electrode 124a electrically connected to the scanning signal 121, the first input electrode 173a electrically connected to the data line 171, and the first output electrode 175a form a switching thin film transistor Qs along with the semiconductor 154a, and the channel of the switching thin film transistor Qs is formed in the semiconductor 154a between the first input electrode 173a and the first output electrode 175a. The second control electrode 124b electrically connected to the first output electrode 175a, the second input electrode 173b electrically connected to the driving voltage line 172, the second output electrode 175b connected to the pixel electrode 191, and the semiconductor 154b form the driving thin film transistor Qd, and the channel of the driving thin film transistor Qd is formed in the semiconductor 154b between the second input electrode 173b and the second output electrode 175b.

A pixel electrode 191, an organic light emitting member 370, and the common electrode 270 form an organic light emitting element having the pixel electrode 191 as an anode and the common electrode 270 as a cathode, or vice versa. Also, the storage electrode 127 and the driving voltage line 172 which overlap each other form a storage capacitor Cst.

The control electrodes 124a and 124b are disposed on the semiconductors 154a and 154b, and the gate insulating layer 140 is disposed between the semiconductors 154a and 154b and the control electrodes 124a and 124b in this case. According to an exemplary embodiment, the data conductor 171, 172, 173b, and 175b may be disposed on the gate insulating layer 140, and may be electrically connected to the semiconductors 154a and 154b through a contact hole (not shown) formed in the gate insulating layer 140. Alternatively, according to another exemplary embodiment, the data conductor 171, 172, 173b, and 175b may be disposed under the semiconductors 154a and 154b and may electrically contact the semiconductors 154a and 154b.

The partition 361, the gaps 260, and the organic light emitting members 370 will now be described in detail with reference to FIG. 4 and FIG. 5.

Figure 4:
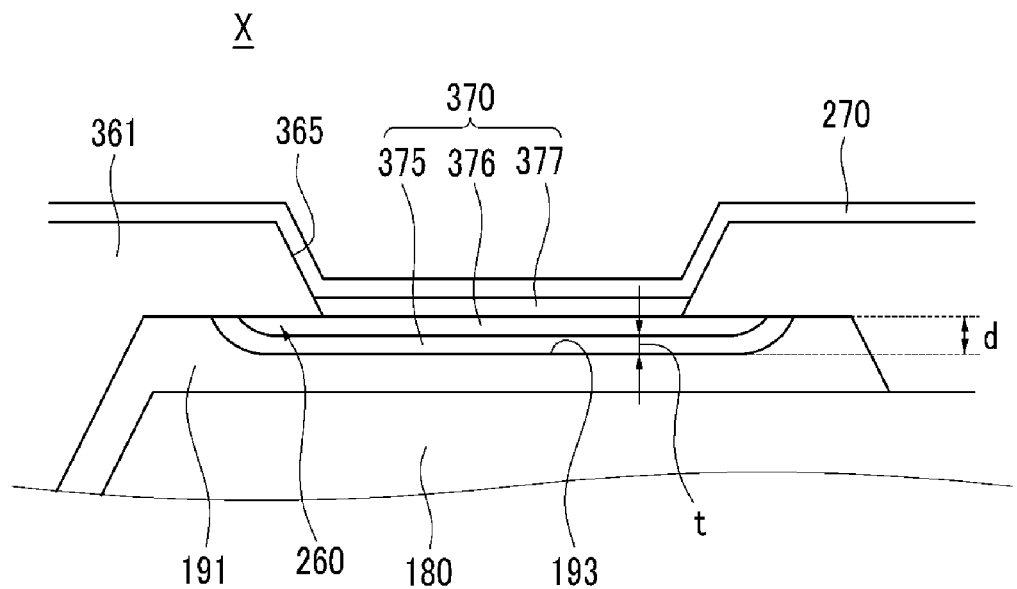
FIG. 4 is an enlarged view of the X portion of the organic light emitting device shown in FIG. 3.
Figure 5:
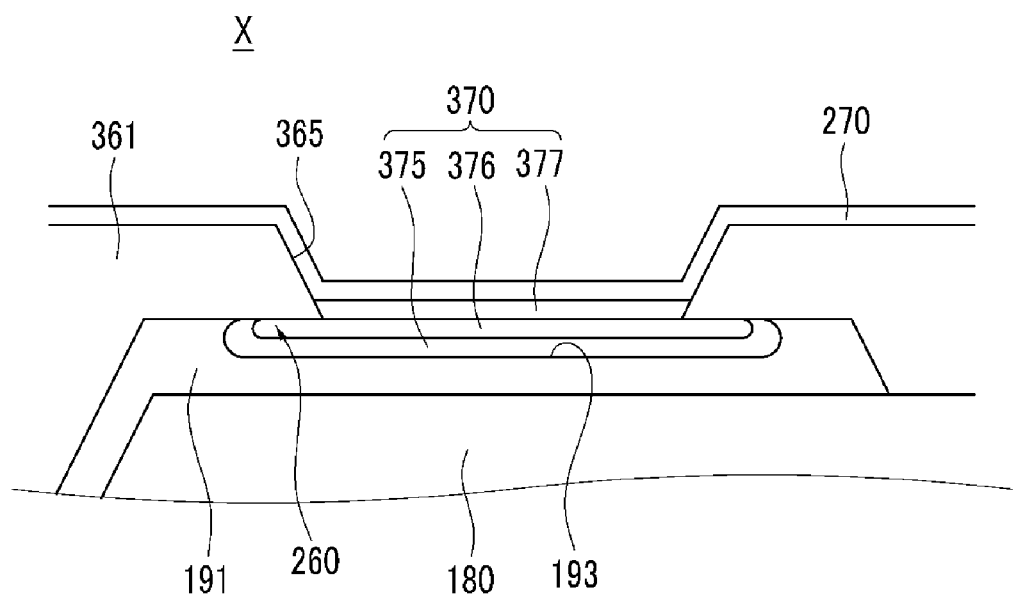
FIG. 5 to FIG. 7 are exemplary embodiments of the enlarged view of the X portion of the organic light emitting device shown in FIG. 3.

FIG. 4 is an enlarged view of the X portion of the organic light emitting device shown in FIG. 3, and FIG. 5 to FIG. 7 are exemplary embodiments of the enlarged view of the X portion of the organic light emitting device shown in FIG. 3.

Referring to FIG. 4, the organic light emitting member 370 is an emission layer 376 and is a multi-layered structure including the emission layer 376 and an auxiliary layer for improving efficiency of light emission of the emission layer 376.

In the current exemplary embodiment, the emission layer 376 is made of an organic material uniquely emitting light of one primary color such as of three primary colors of red, green, and red, or a mixture of the organic material and the inorganic material. The organic light emitting device displays desired images by spatially combining the color light of the primary colors emitted by the emission layer 376.

According to an exemplary embodiment, the auxiliary layer includes a hole transport layer 375 and an electron transport layer 377 which controls the balance of electrons and holes. The hole transport layer 375 and the electron transport layer 377 may be substituted with an electron injecting layer and an hole injecting layer. Also, the auxiliary layer may additionally include an electron injection layer and a hole injection layer as well as the hole transport layer 375 and the electron transport layer 377 for enhancing the injection of electrons and holes.

Figure 6:
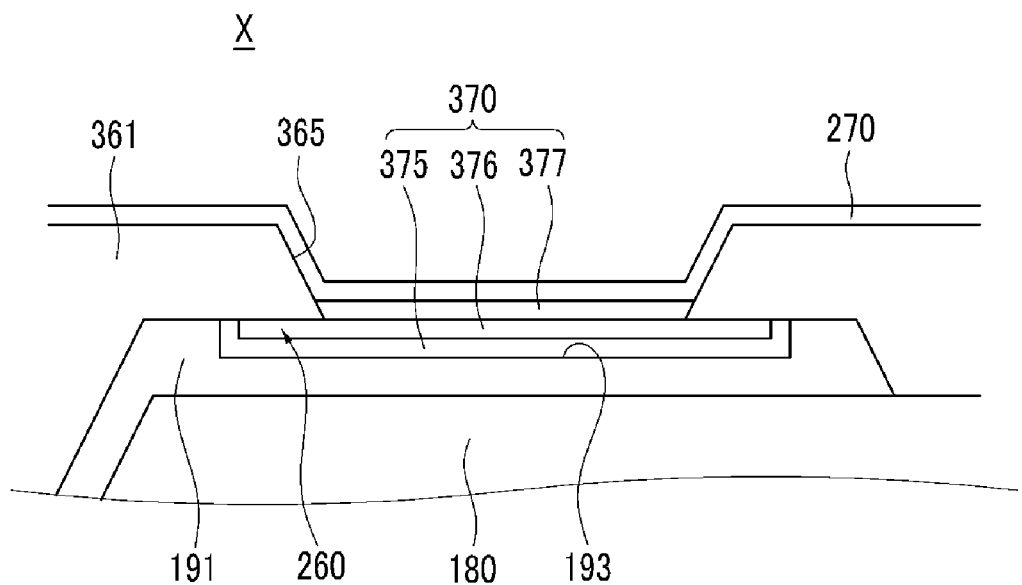

In the current exemplary embodiment, the recess portion 193 of the pixel electrode 191 includes a bottom surface and a side surface formed according to the circumference of the bottom surface. The bottom surface of the recess portion 193 is parallel to the passivation layer 180, and the side surface is a curved surface and its cross-section is substantially a quarter-circle. However, the present invention is not limited hereto and may vary accordingly. For example, as shown in FIG. 5, the cross-section of the side surface of the recess portion 193 is substantially a half-circle. Furthermore, as shown in FIG. 6, the side surface of the recess portion 193 is perpendicular to the bottom surface of the recess portion 193.

The side surface of the recess portion 193 limits the gap 260 along with the partition 361. An interval "d" between the lower surface of the partition 361 limiting the gap 260 and the bottom surface of the recess portion 193 may be in the range of approximately 30 Å to approximately 2000 Å. If the interval "d" is less than approximately 30 Å, the etching operation of the pixel electrode 191 becomes difficult, and if the interval "d" is more than approximately 2000 Å, the thickness of the pixel electrode 191 is far larger than approximately 2000 Å such that the material for forming the pixel electrode 191 is wasted and transmittance is decreased.

The hole transport layer 375 is formed on the pixel electrode 191. The end portion of the hole transport layer 375 is contacted with the lower surface of the partition 361 limiting the gap 260. The thickness "t" of the hole transport layer 375 is in the range of approximately 500 Å to approximately 2000 Å. If the thickness "t" of the hole transport layer 375 is less than approximately 500 Å or more than approximately 2000 Å, a lifetime of the organic light emitting element may be reduced, and particularly, if the thickness "t" is more than approximately 2000 Å, the transmittance is decreased.

The average surface roughness $R_{avg}$ of the pixel electrode 191 contacted with the hole transport layer 375 is in a range of approximately 0.5 nm to approximately 5.0 nm. When the average surface roughness of the pixel electrode 191 is in the range of approximately 0.5 nm to approximately 5.0 nm, the hole transport layer 375 covers the surface of the pixel electrode 191 such that the emission layer 376 is completely separated from the pixel electrode 191.

The emission layer 376 is formed on the hole transport layer 375. The emission layer 376 contacts an upper surface of the hole transport layer 375, and end portions thereof contact the lower surface of the partition 361 limiting the gap 260. The upper surface of the emission layer 376 is disposed with substantially the same plane as a lower surface of the partition 361 limiting the gap 260. That is, according to an exemplary embodiment, the emission layer 376 is positioned under the opening 365 of the partition 361 i.e., inside the recess portion 193 of the pixel electrode 191.

As a result, the hole transport layer 375 and the emission layer 376 are wholly filled in the gap 260. According to an exemplary embodiment, the hole transport layer 375 and the emission layer 376 may be filled through a capillary phenomenon. The emission layer 376 completely covers the hole transport layer 375.

The electron transport layer 377 is formed on the emission layer 376. The electron transport layer 377 is disposed on the emission layer 376 to cover the hole transport layer 375 such that the electron transport layer 377 is completely separated from the hole transport layer 375. The common electrode 270 is formed on the electron transport layer 377.

Figure 7:
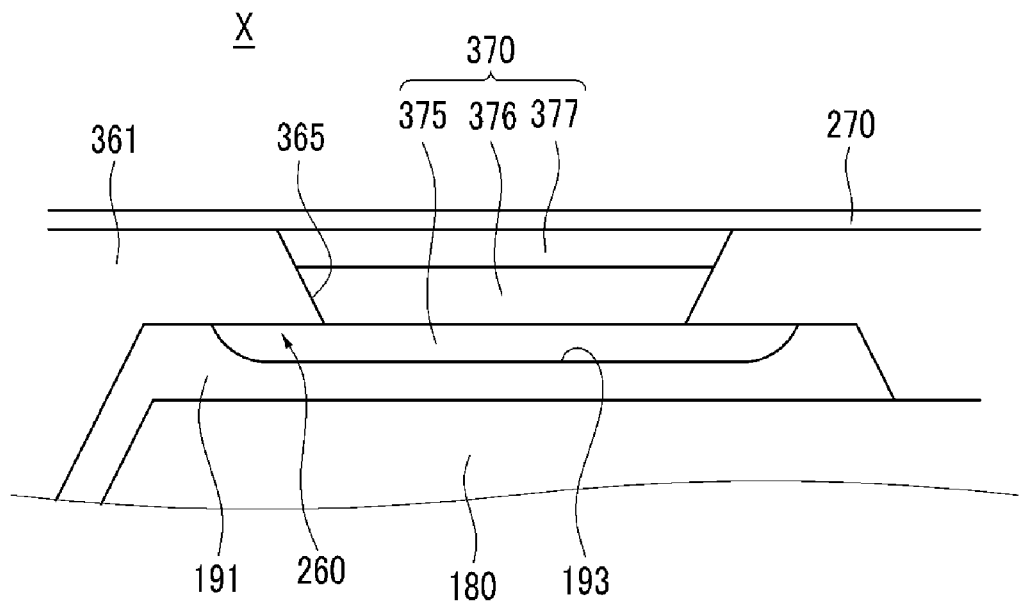

On the other hand, as shown in FIG. 7, only the hole transport layer 375 is be disposed in the recess portion 193 and the gap 260 of the pixel electrode 191, and the emission layer 376 may be disposed in the opening 365 of the partition 361. In current exemplary embodiment, the emission layer 376 completely covers the hole transport layer 375, and the common electrode 270 may be formed on the partition 361 and the electron transport layer 377, without step coverage.

According to an exemplary embodiment, the electron injection layer is disposed between the electron transport layer 377 and the common electrode 270, and the hole injection layer may be disposed between the pixel electrode 191 and the hole transport layer 375.

According to the current exemplary embodiment, the emission layer 376 is completely filled in the gap 260 such that the hole transport layer 375 and the electron transport layer 377 are physically and electrically separated from each other. Accordingly, a leakage current is prevented and luminance deterioration may be prevented.

A manufacturing method of the organic light emitting device according to an exemplary embodiment of the present invention will now be described with the reference to FIG. 8 to FIG. 11.

Figure 8:
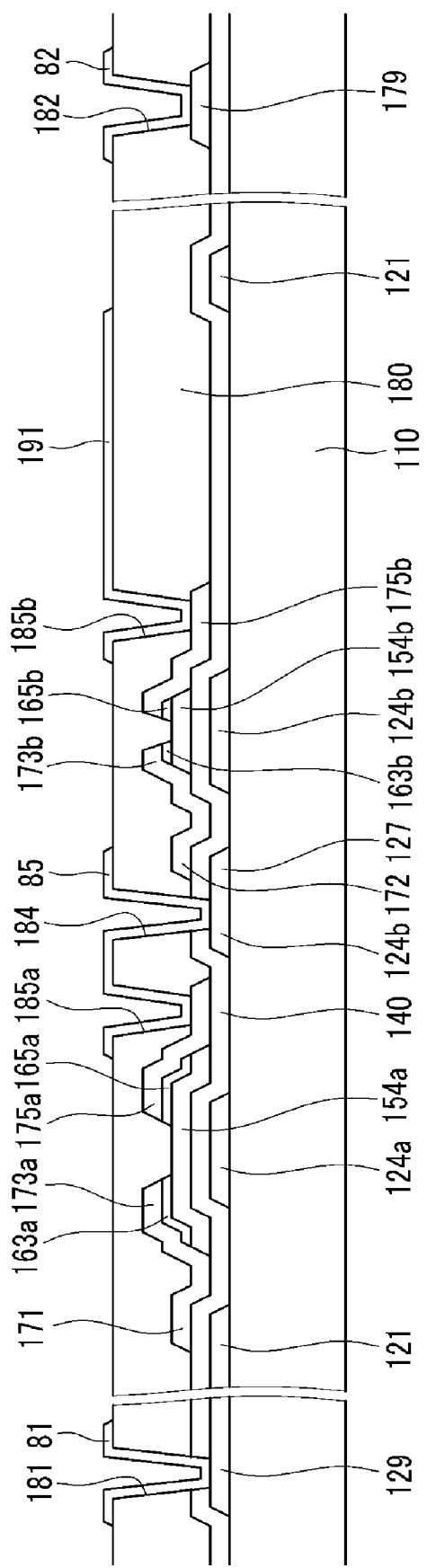
FIG. 8 to FIG. 12 are cross-sectional views sequentially illustrating a manufacturing method of the organic light emitting device according to the present invention.
Figure 9:
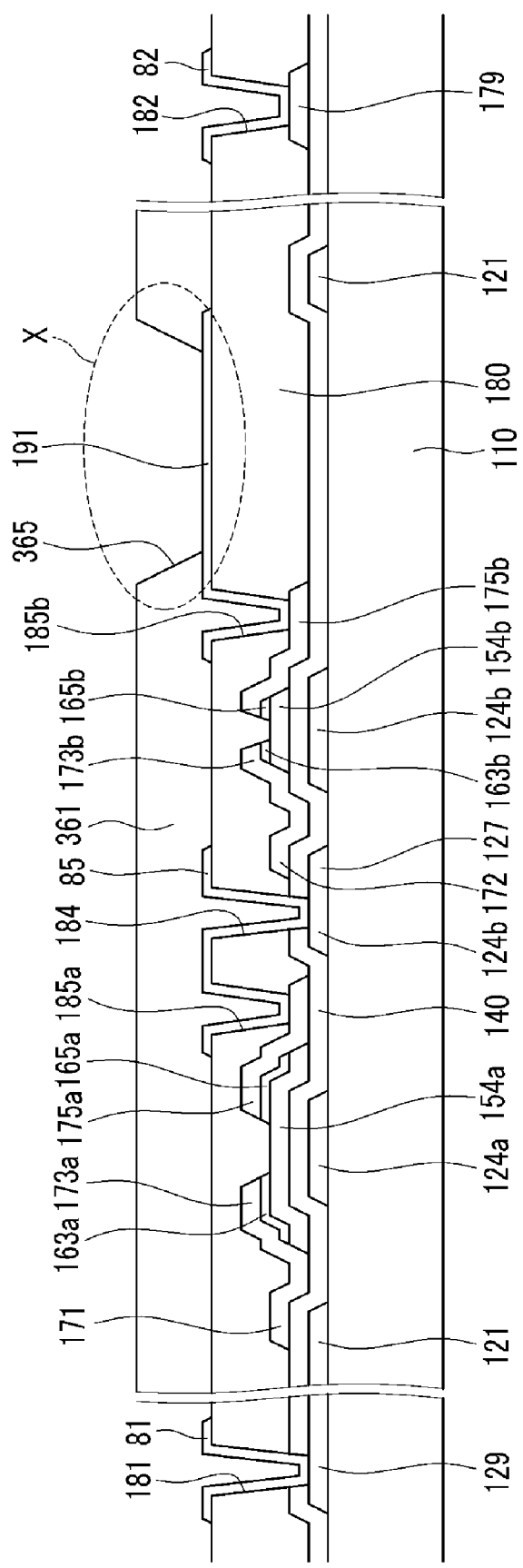
Figure 10:
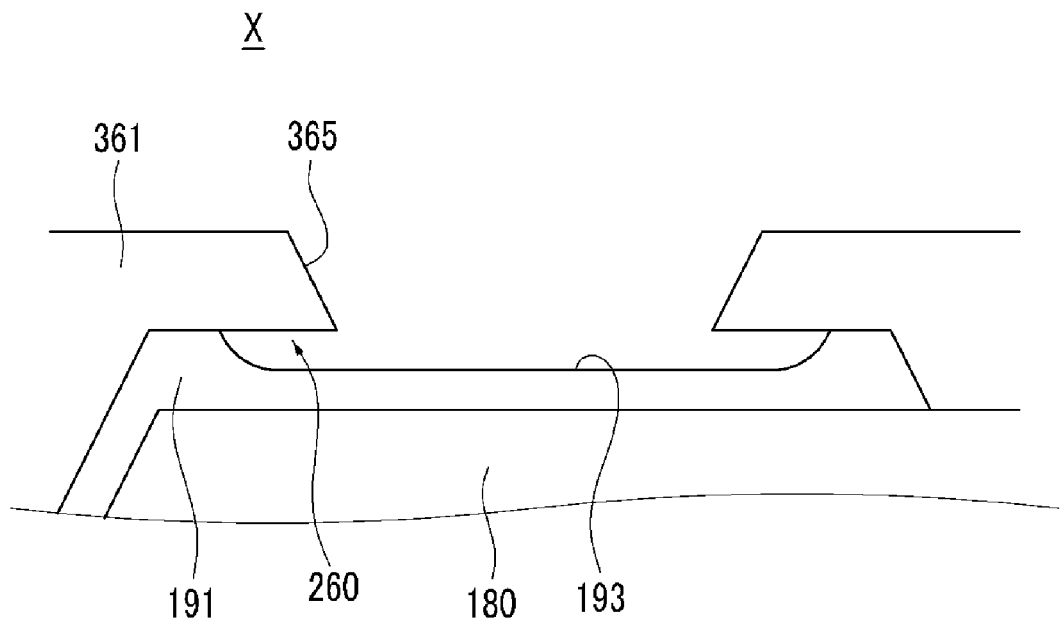
Figure 11:
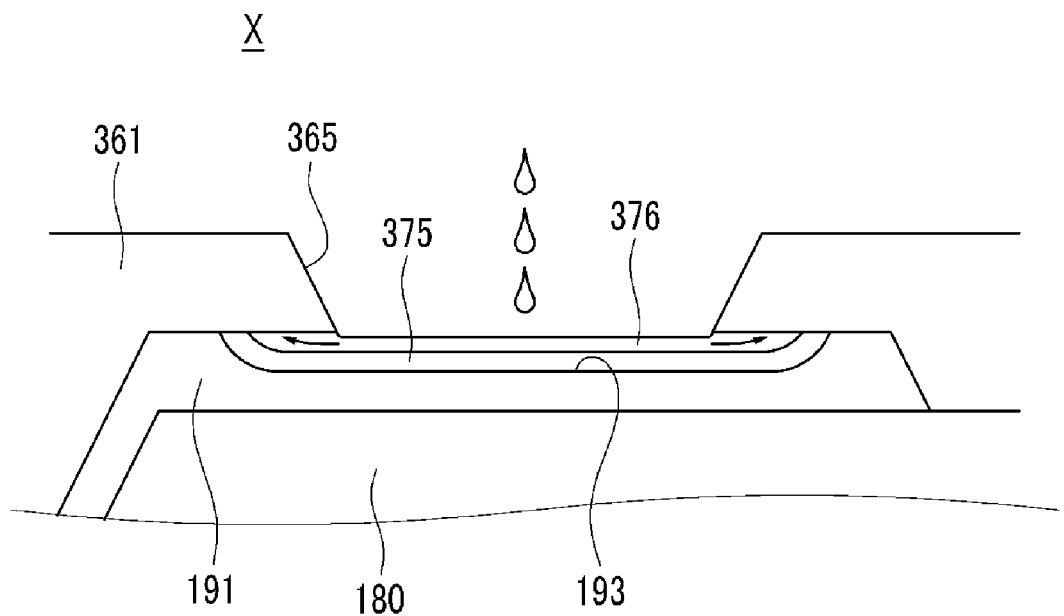
Figure 12:
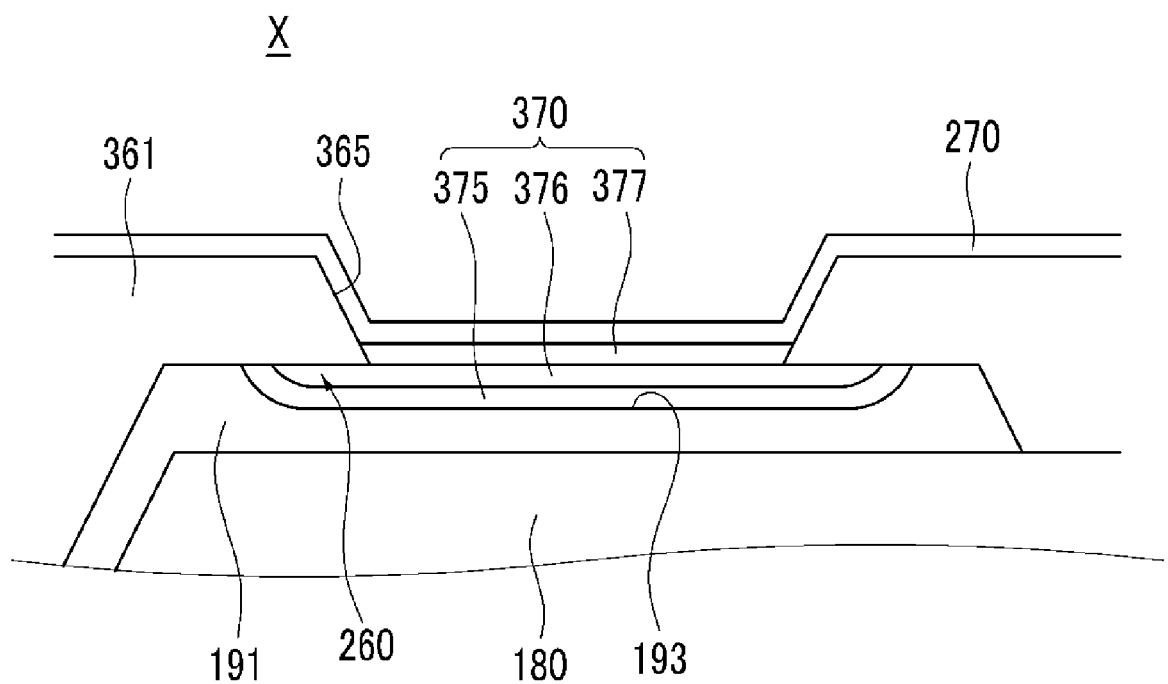

FIG. 8 through FIG. 12 are cross-sectional views sequentially illustrating the manufacturing method of the organic light emitting device according to an exemplary embodiment of the present invention, and particularly FIG. 10 through FIG. 12 are cross-sectional views enlarging the X portion of FIG. 9.

As shown in FIG. 8, a gate conductor including a gate line 121, first and second control electrodes 124a and 124b, and a storage electrode 127, a gate insulating layer 140, first and second semiconductors 154a and 154b, first and second ohmic contacts 163a, 165a, 163b, and 165b, a data conductor including a data line 171, a driving voltage line 172, first and second output electrodes 175a and 175b, a passivation layer 180, and a pixel electrode 191 are sequentially formed on the substrate 110. When forming the pixel electrode 191, a connecting member 85 and contact assistants 81 and 82 are formed together.

As shown in FIG. 9, an organic insulator layer or an inorganic insulator layer is formed on the passivation layer 180, the pixel electrode 191, and the connecting member 85. Next, an opening 365 exposing the pixel electrode 191 is formed.

Then, as shown in FIG. 10, the exposed portion of the pixel electrode 191 not covered by the partition 361 is partially etched by using the partition 361 as a mask, to form a recess portion 193. In the current exemplary embodiment, the portion of the pixel electrode 191 contacted with the partition 361 is etched with a relatively slower speed than at other portions such that an undercut is generated between the partition 361 and the pixel electrode 191, thereby forming a gap 260. The depth of the recess portion 193 of the pixel electrode 191 and a shape of the cross-section of the gap 260 is changed according to the etching process conditions.

Next, as shown in FIG. 11, an organic material is dripped in the recess portion 193 of the pixel electrode 191 through an Inkjet method to form a hole transport layer 375. According to an exemplary embodiment, the hole transport layer 375 is formed of a mixture of an organic material and an inorganic material. The organic material is filled in the gap 260 by a capillary phenomenon, and the organic material includes a uniform thickness according to the surface tension and the adhesion with the gap 260. Next, an organic material or a mixture of an organic material and an inorganic material for emitting light is dripped on the hole transport layer 375 through an Inkjet method to form an emission layer 376. The organic material or the mixture of the organic material and the inorganic material is filled in the gap 260 by a capillary phenomenon, and its end portion is contacted with the lower portion of the partition 361 limiting the gap 260. Accordingly, the emission layer 376 includes the uniform thickness according to the surface tension and the adhesion with the gap 260, and completely covers the hole transport layer 375.

On the other hand, according to an exemplary embodiment, as shown in FIG. 7, when the hole transport layer 375 is only disposed in the gap 260 and the recess portion 193, the emission layer 376 disposed thereon is formed by a photolithography process. A hole injection layer is additionally formed between the hole transport layer 375 and the pixel electrode 191.

Next, as shown in FIG. 12, an electron transport layer 377 is formed on the emission layer 376, and a common electrode 270 is formed thereon. An electron injection layer is formed between the electron transport layer 377 and the common electrode 270. The electron transport layer 377 and the electron injection layer is formed by the Inkjet method or the photolithography process.

According to an exemplary embodiment, the emission layer 376 may be totally uniformly formed, and the emission layer 376 is completely separated from the hole transport layer 375 and the electron transport layer 377, thereby preventing the leakage current.

While various embodiments of the present invention and its advantage, it is noted that various changes, substitutions and alterations can be made herein without departing from the spirit and scope of the invention as defined by appended claims.

What is claimed is:

1. An organic light emitting device comprising:
    a substrate;
    a first electrode formed on the substrate, the first electrode comprising a recess portion;
    a partition formed on the first electrode, the partition comprising an opening exposing the recess portion of the first electrode;
    an organic light emitting member formed in the recess portion of the first electrode and the opening of the partition; and
    a second electrode formed on the partition and the organic light emitting member,
    wherein a gap is formed between a lower portion of the partition and the recess portion of the first electrode and at least a portion of the organic light emitting member is disposed in the gap.

2. The organic light emitting device of claim 1, wherein the organic light emitting member includes a hole transport layer and an emission layer, and the hole transport layer includes a portion disposed on the gap.

3. The organic light emitting device of claim 2, wherein the emission layer includes a portion disposed on the gap.

4. The organic light emitting device of claim 2, wherein the recess portion of the first electrode includes a bottom surface and a side surface formed according to a circumference of the bottom surface.

5. The organic light emitting device of claim 4, wherein the side surface of the recess portion is disposed in the gap.

6. The organic light emitting device of claim 5, wherein the side surface of the recess portion is vertically positioned to the bottom surface of the recess portion.

7. The organic light emitting device of claim 5, wherein the side surface of the recess portion is a curved surface, and a cross-section of the side surface is shaped in one of a half-circle, a quarter-circle, or a half-ellipse.

8. The organic light emitting device of claim 7, wherein an interval between a lower surface of the partition and the bottom surface of the recess portion is in a range of approximately 30 Å to approximately 2000 Å.

9. The organic light emitting device of claim 2, wherein a thickness of the hole transport layer is in a range of approximately 500 Å to approximately 2000 Å.

10. The organic light emitting device of claim 9, wherein an average surface roughness of the first electrode is in a range of approximately 0.5 nm to approximately 5.0 nm.

11. The organic light emitting device of claim 9, further comprising:
an electron transport layer formed on the emission layer and disposed in the opening of the partition.

12. The organic light emitting device of claim 11, wherein:
the second electrode is disposed on the electron transport layer; and
a first portion of the second electrode overlapping the electron transport layer is disposed in a same plane as a second portion of the second electrode overlapping the partition.

13. A manufacturing method for an organic light emitting device, comprising:
forming a first electrode on a substrate;
forming a partition having an opening, on the first electrode;
etching the first electrode by using the partition as a mask to form a recess portion;
forming a gap under the partition;
forming an organic light emitting member in the recess portion by filling at least a portion of the gap; and
forming a second electrode on the organic light emitting member.

14. The method of claim 13, wherein
forming the partition comprises:
forming a photosensitive organic material layer or a photosensitive inorganic material layer on the first electrode; and
exposing and etching the photosensitive organic material layer or the photosensitive inorganic material layer to form an opening exposing the first electrode.

15. The method of claim 14, further comprises:
forming the organic light emitting member by an Inkjet method.

16. The method of claim 15, further comprises:
filling the organic light emitting member in the gap by a capillary phenomenon.

17. The method of claim 13, wherein
forming the organic light emitting member comprises:
forming a hole injection layer on the first electrode; and
forming an emission layer on the hole injection layer.

18. The method of claim 17, further comprises:
filling the hole injection layer in the gap.

19. The method of claim 17, further comprises:
filling the hole injection layer and the emission layer in the gap.

* * * * *